United States Patent [19]

Takei

[11] Patent Number: 4,840,139
[45] Date of Patent: Jun. 20, 1989

[54] APPARATUS FOR THE FORMATION OF A FUNCTIONAL DEPOSITED FILM USING MICROWAVE PLASMA CHEMICAL VAPOR DEPOSITION PROCESS

[75] Inventor: Tetsuya Takei, Ueno, Japan

[73] Assignee: Canon Kabushiki Kaisha, Tokyo, Japan

[21] Appl. No.: 102,010

[22] Filed: Sep. 28, 1987

[30] Foreign Application Priority Data

Oct. 1, 1986 [JP] Japan .................................. 61-231304

[51] Int. Cl.[4] .............................................. C23C 16/00
[52] U.S. Cl. .................................... 118/723; 118/733; 118/501
[58] Field of Search ....................... 118/723, 733, 50.1

[56] References Cited

U.S. PATENT DOCUMENTS 4,365,587  12/1982  Hirose ................................. 118/723
4,430,138   2/1984  Suzuki ................................ 118/730
4,450,787   5/1984  Weakliem .......................... 118/723
4,534,314   8/1985  Ackley ............................... 118/733
4,582,773   4/1986  Johncock et al. ................... 430/65

Primary Examiner—Richard Bueker
Attorney, Agent, or Firm—Fitzpatrick, Cella, Harper & Scinto

[57] ABSTRACT

An improved apparatus for the formation of a functional deposited film using microwave plasma chemical vapor deposition process is characterized in that an opening and shutting member to form an opening for taking a substrate in or out a deposition chamber and the circumferential wall of the deposition chamber are sealed by an electromagnetic wave shielding means and a vacuum sealing means being arranged in this order from the side of the microwave plasma generating space, which prevent deterioration of the vacuum sealing means and makes it possible to repeatedly form a desired functional deposited film of high quality at a high deposition rate.

4 Claims, 5 Drawing Sheets

APPARATUS FOR THE FORMATION OF A FUNCTIONAL DEPOSITED FILM USING MICROWAVE PLASMA CHEMICAL VAPOR DEPOSITION PROCESS

FIELD OF THE INVENTION

This invention relates to an apparatus using microwave plasma chemical vapor deposition process for the formation of a functional deposited film such as an amorphous silicon film on a substrate, which is usable especially as a photoconductive member for semiconductor devices, photosensitive devices for use in electrophotography, image input line sensors, image pickup devices, photoelectromotive force devices or the like.

BACKGROUND OF THE INVENTION

Hitherto, as the element member of semiconductor devices, photosensitive device for use in electrophotography, image input line sensors, image pickup devices, or other optical devices, there have been proposed a number of amorphous semiconductor film, for instance, an amorphous deposited film composed of an amorphous silicon material compensated with hydrogen atom or/and halogen atom such as fluorine atom or chlorine atom [hereinafter referred to as "A—Si(H,X)"]. Some of such films have been put to practical use.

Along with those amorphous semiconductor films, there have been proposed various methods for their preparation using plasma chemical vapor deposition technique wherein a raw material is decomposed by subjecting it to the action of an energy of direct current, high frequency or microwave glow discharging to thereby form a deposited film on a substrate of glass, quartz, heat-resistant resin, stainless steel or aluminum. And there have been also proposed various apparatus for practicing such methods.

Now, in recent years, the public attention has been focused on plasma chemical vapor deposition process by means of microwave glow discharging decomposition [hereinafter expressed by the abbreviation "MW-PCVD process"] also at industrial level.

One representative apparatus for practicing such MW-PCVD process is such that has a structure as shown in a schematic perspective drawing of FIG. 3.

In FIG. 3, there are shown a whole reaction chamber 301, a substantially enclosed deposition chamber 302, a microwave introducing window 303 which is made of a dielectric material such as alumina ceramics or quartz, a wave guide 304 which transmits microwaves, a microwave power source 305 which generates microwaves, an exhaust pipe 306 being connected through an exhaust valve (not shown) to an exhaust apparatus (not shown), a ring-shaped gas feed pipe 307 being connected through a valve 313 to gas reservoirs (not shown), gas liberation holes 307', a substrate holder 308, a substrate 309 onto which a deposited film is to be formed, an electric heater 310 for heating the substrate, a plasma generation space 311 and microwaves generated from 312 from microwave power source 305.

The deposition chamber 302 ordinarily has a cavity resonant structure so as to resonant with the frequency of the microwave power source 305.

The film forming operation in the apparatus shown in FIG. 3 is carried out in the following way.

That is, the air in the deposition chamber 302 is evacuated by opening the main valve of the exhaust pipe 306 to bring about the space in the chamber to a predetermined vacuum. And the heater 310 installed in the substrate holder is actuated to uniformly heat the substrate 309 to a predetermined temperature and it is kept at that temperature.

Then, raw material gases, for instance, silane gas and hydrogen gas etc. in the case of forming an amorphous silicon deposited film, are introduced into the deposition chamber 302 through the gas feed pipe 307 and its gas liberation holes 307'.

At the same time, microwaves 312 having a frequency of more than 500 MHz, preferably of 2.45 GHz are generated by the microwave power source 305, which is successively introduced into the deposition chamber 302 through the wave guide 304 and the microwave introducing window 303. The raw material gases thus introduced into the deposition chamber 302 are excited and dissociated by an energy of the microwave to generate neutral radical particles, ion particles, electrons and the like and to cause chemical reactions among them resulting in formation of a deposited film on the surface of the substrate 309.

It is conventional for the above-mentioned apparatus to provide at least an opening and shutting member (hereinafter referred to as "removable member") that allows the formation of an opening sufficient enough to or remove the substrate and also to conduct relevant maintenance and inspection of the inside of the deposition chamber. For such removable member, it is required to have an appropriate sealing means which enables one not only to maintain the inside of the deposition chamber in a state of vaccum but also to maintain the gaseous atmosphere of the introduced raw material gases in the deposition chamber.

As such sealing means, there are known, for instance, a metallic gasket and a rubber gasket. Among these gaskets, the rubber gasket is widely used in views of its excellent repeated usability and its sealing reliability.

In FIG. 1 (C), there is shown a schematic partial cross-sectional view for a typical example of such known removable member in the known apparatus for the formation of a functional deposited film by means of MW-PCVD.

In FIG. 1(C), there are shown a microwave plasma generation space 101 of the deposition chamber, a removable member 102 for allowing the formation of the foregoing opening and a circumferential wall portion 103 of the deposition chamber being closely contacted through a vacuum sealing means 105 with the removable member 102 while forming a clearance 104.

For the known MW-PCVD apparatus having such vacuum sealing system as shown in FIG. 1(C), there are problems in that when a microwave is introduced into the plasma generation space 101, part of it often gets into the clearance 104 and then leakes out of the plasma generation space 101 or otherwise. As a result, it becomes absorbed by the vacuum sealing means 105 which then is heated and deteriorates.

Other than the above, there are also other problems in that the vacuum sealing means 105, the inner wall surface of the removable member 102 and the upper wall surface of the circumferential wall portion 103 of the deposition chamber will be contaminated with an undesired deposited film and powdery particles caused by plasmas containing active species resulting from the decomposition of raw material gases during the formation of a desired deposited film on a substrate in the deposition chamber. The removal of these contaminants after completion of the film forming process is difficult even by a proper cleaning means such as dry etching because of the narrowness of the clearance. In addition, in the case where removal of such foreign matters is attempted by means of dry etching, the vacuum sealing means 105 will be deteriorated by an etching energy, a heat caused by plasmas, active species such as fluorine radical, etc.

Further in addition, the known MW-PCVD apparatus is inconsistent in repeatedly producing a deposited film by repeatedly operating it such that the quality of a resulting deposited film will be gradually reduced as it is repeatedly operated. That is because the sealing function of the vacuum sealing means comprising a rubber gasket for example will be decreased as a result of its deterioration caused by the absorption of an microwave and because of this, such foreign matters as mentioned above will be increasingly formed. They eventually intermix with the resulting film to thereby provide an undesirable defect thereon. Microwave plasmas will also enter into the region where said rubber gasket is placed to cause formation of a foreign deposited film. Powdery particles are eventually deposited or adhered onto said rubber gasket or surrounding members to thereby deteriorate the sealing function. Foreign matter attaches to the substrate when it is taken in the deposition chamber or when a raw material gas is introduced into the deposition chamber to thereby invite an undesirable defect on the resulting deposited film.

These problems are aggravated particularly in the case of forming a silicon containing amorphous film such as a film composed of A—Si(H,X) at a high deposition rate by decomposing a silicon atom containing raw material gas such as silane gas ($SiH_4$) using the foregoing apparatus for such reasons that a high microwave energy is used and powdery particles of polysilicon and the like are likely to generate in this case. These problems will often occur even in the case where a substrate small in size is used.

For instance, in case of a photosensitive member for use in electrophotography, since its light receiving layer is usually such that has a thickness of, for example, 20 to 40 μm, it takes a long period of time for the formation thereof. Because of this, should the foregoing problems occur during the film forming process, the resulting layer is accompanied with such defects to make the resulting photosensitive member practically inapplicable.

SUMMARY OF THE INVENTION

This invention is aimed at eliminating the foregoing problems in the conventional apparatus for the formation of a deposited film using MW-PCVD process and providing an improved apparatus for practicing MW-PCVD process which enables one to stably form a desirable functional deposited film which is usable as an element member for semiconductor devices, photosensitive devices of electrophotography, image reading line sensors, image pickup devices, photoelectromotive members, or other electronic and optical devices at a high deposition rate.

That is, the principal object of this invention is to provide an improved apparatus for forming a functional deposited film using MW-PCVD process which enables one to stably form a desired functional deposited film of excellent quality even in the case of forming a relatively thick film at a high deposition rate on a large square substrate, for example, for a photosensitive member for use in electrophotography.

Another object of this invention is to provide an improved apparatus for practicing MW-PCVD process which enables one to mass-produce a desired functional deposited film having a wealth of excellent electric, optical and photoconductive characteristics.

The present inventor has made earnest studies for overcoming the foregoing problems on the known apparatus for forming a functional deposited film using MW-PCVD process and attaining the objects of this invention as described above and as a result, the present inventor has obtained a found that such problems on the known apparatus for forming a functional deposited film using MW-PCVD process can be overcome by optimizing the structure around the vacuum sealing means for the removable member.

Therefore, the principal feature of this invention is directed to improvements in the known apparatus for the formation of a functional deposited film using microwave plasma CVD process which comprises a substantially enclosed deposition chamber, a means for supporting a substrate on which a functional deposited film is to be deposited, a means for supplying raw material gases, a means for evacuating the inside of said deposition chamber and a means for generating microwave discharge plasmas in said deposition chamber, the improvements characterized in that said deposition chamber is provided with at least one removable member (that is, opening and shutting member) to form an opening for taking a substrate in or out said deposition chamber, and the circumferential wall of said deposition chamber and said removable member being sealed by an electromagnetic wave shielding means and a vacuum sealing means being arranged in this order from the side of the microwave plasma generation space 101 so as to substantially enclose the inside of said deposition chamber from the outer space.

DESCRIPTION OF THE INVENTION

Representative embodiments of an improved apparatus for forming a functional deposited film using MW-PCVD process according to this invention will now be explained in detail with reference to the drawings. The description is not intended to limit the scope of this invention.

Figure 1A:
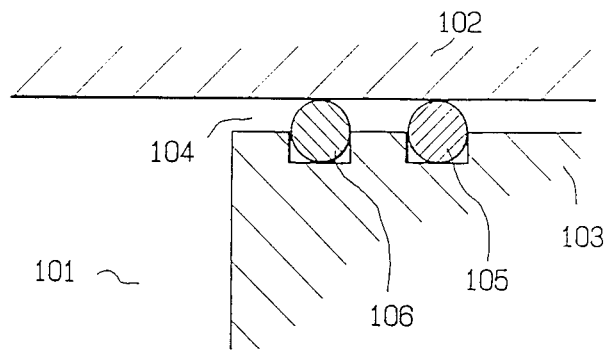
FIGS. 1(A) and 1(B) are schematic partial cross sectional views illustrating typical examples of the portion around a vacuum sealing means in an improved apparatus for forming a deposited film by using microwave plasma CVD process according to this invention.

There is shown a typical example of the apparatus according to this invention in FIG. 1(A), in which are shown a microwave plasma generation space 101, a removable member (opening and shutting member) 102 for forming an opening, a circumferential wall portion 103 of the deposition chamber, a clearance 104 between the removable member 102 and the circumferential wall portion 103, a vacuum sealing means 105 and an electromagnetic wave shielding means 106. Wherein the circumferential wall portion 103 and the removable member 102 being sealed by the electromagnetic wave shielding means 106 and the vacuum sealing means 105 being arranged in this order from the side of the microwave plasma generation space so as to substantially enclose the microwave plasma generation space 101 from the outer space.

In the apparatus having the vacuum sealing structure shown in FIG. 1(A) according to this invention, a microwave to be introduced at the time of forming a deposited film on a substrate is prevented from propagating beyond the electromagnetic wave shielding means 106 because of its function to thereby prevent the vacuum sealing means 105 from being deteriorated. Because of this, attachment of foreign matters such as an undesired deposited film and powdery particles occurs mostly at the electromagnetic wave shielding means 106 and the sealing efficiency of the vacuum sealing means 105 may be maintained without being lowered. And those foreign matters attached on the electromagnetic wave shielding means 106 can be easily and effectively removed by means of dry etching.

In addition, when using, as the electromagnetic wave shielding means 106, a means capable of attaining a required shielding by making a microwave reflected, a localized difference in the microwave reflection does not easily occur so that it becomes easier to make a cavity resonant condition which results in obtaining a desirably large Q-factor, in the deposition chamber.

Figure 1B:
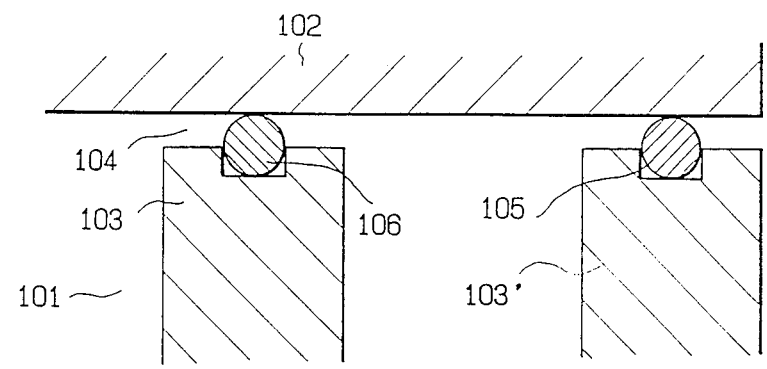

There is shown another typical example of the apparatus according to this invention in FIG. 1(B), which is a modification of the apparatus shown in FIG. 1(A).

In this example, the deposition chamber is provided with two circumferential walls being concentrically arranged. The electromagnetic wave shielding means 106 is disposed on the interior circumferential wall portion 103 of the deposition chamber and the vacuum sealing means 105 is disposed on the exterior circumferential wall portion 103' of the deposition chamber.

Now, in the apparatus according to this invention, there can be used a plurality of either electromagnetic wave shielding means or vacuum sealing means. They can be arranged in any order as long as the electromagnetic wave shielding means 106 is always situated at the position nearest to the microwave plasma generation space and interior to the vacuum sealing means 105.

In order to effectively attain the objects of this invention, it is important for the electromagnetic wave shielding means 106 to have an elasticity sufficient enough to follow the changes in the clearance 104 caused by changes of the inner pressure of the deposition chamber and the like.

As such electromagnetic wave shielding means, it is desired to use an electromagnetic wave shielding member of spring structure having a L-letter shaped portion or a circular portion made of a metallic material having a large elasticity.

In the viewpoint of durability and reliability, metallic shielding members such as those having, as a constituent part, a cylindrical structure, a partially cut-off cylindrical structure (a C-letter like shaped structure), a spiral structure, or a structure deformed from one of these structures are particularly desirable. And the electromagnetic wave shielding means 106 is especially effective in the case where the clearance on the side of the microwave plasma generation space in connection with the wave length ($\lambda$) of the microwave used is preferably less than $\lambda/8$ and more preferably, less than $\lambda/16$.

As the constituent material for the foregoing electromagnetic wave shielding member, it is desired to use a metal such as iron, copper, nickel, chromium, aluminum, tin, zinc or an alloy containing at last one of these metals, and among these materials, stainless steel is particularly preferable.

And, more desirable results can be obtained in the case where such constituent material for the foregoing electromagnetic wave shielding member has a metallic coat formed by means of plating, vacuum deposition or reactive sputtering. Usable as such metallic coat are, for example, gold, silver, cadmium, chromium, tin, lead, nickel, beryllium, zinc, magnesium, etc.

In order to form a desired functional deposited film using the apparatus according to this invention, various kinds of raw materials can be selectively used depending upon the kind of a deposited film to be obtained as long as they can be excited with an activation energy of high frequency or microwave to thereby generate proper active species capable of causing the formation of a desired deposited film on a substrate.

For instance, in the case of forming a deposited film composed of A—Si(H,X), there can be used gaseous or easily gasifiable compounds such as silanes and their derivatives containing halogen atom or hydrocarbon groups. It is possible to use one or more of these compounds.

And, in order to introduce a raw material gas of such compound into the deposition chamber, it is of course possible to dilute it with a proper dilution gas such as He and Ar in case it becomes necessary.

Further, it is possible to dope said A—Si(H,X) film with a p-type dopant or an n-type dopant. In order to form such doped A—Si(H,X) film, a raw material gas capable of imparting such dopant or a mixture of a film forming raw material gas and said dopant imparting raw material gas is introduced into the deposition chamber.

As for the substrate, it may be conductive, semiconductive or electrically insulating. Specifically, metal, ceramics, glass or the like can be mentioned. The substrate temperature upon forming a film is not particularly limited. However it is preferably 30° C. to 450° C. and more preferably, 50° C. to 350° C.

As for the inner pressure of the deposition chamber upon forming a deposited film, it is desired that said inner pressure is firstly kept at $1 \times 10^{-6}$ Torr or less prior to introducing a raw material gas and later on after the raw material is introduced, it is kept preferably at $1 \times 10^{-2}$ to 1 Torr, more preferably at $5 \times 10^{-2}$ to 1 Torr.

As above described, the formation of a deposited film using the apparatus according to this invention is usually carried out by introducing a film forming raw material gas (without being excited beforehand) in the deposition chamber, exciting it with the action of an activation energy of microwave to thereby generate active species and causing a chemical reaction among them.

However, in the case of using two or more kinds of film forming raw material gases, it is possible to excite one of them with a proper activation energy beforehand and to introduce the resultant active species into the deposition chamber.

DESCRIPTION OF THE PREFERRED EMBODIMENTS

This invention will be described more specifically while referring to the following Example, but the invention is not intented to limit the scope only to the example.

Example

Figure 2A:
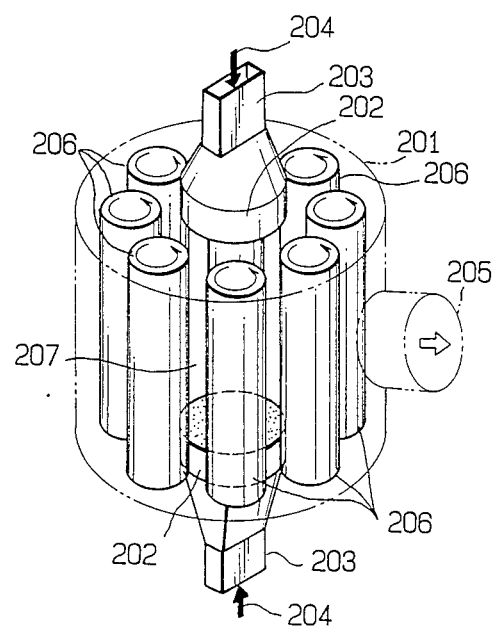
FIGS. 2(A) and 2(B) are schematic perspective views illustrating a typical example of the apparatus for forming a functional deposited film on a cylindrical substrate by using microwave plasma CVD process according to this invention.
Figure 2B:
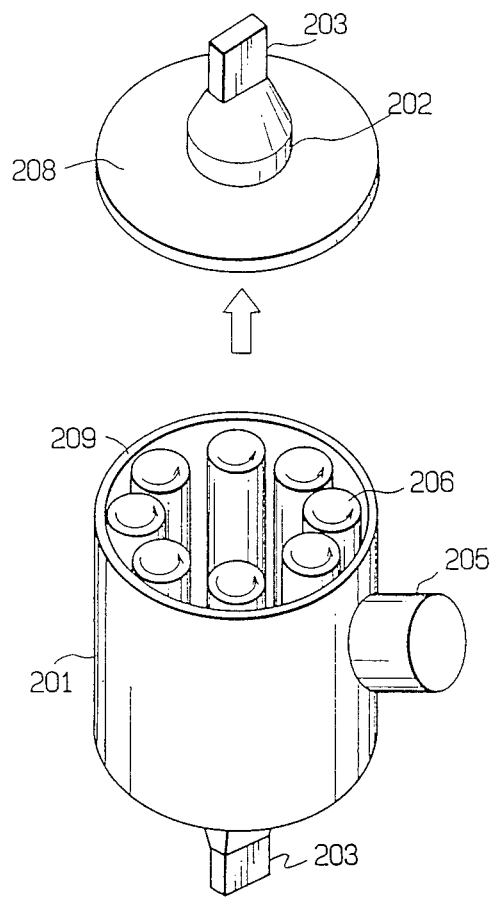
Figure 3:
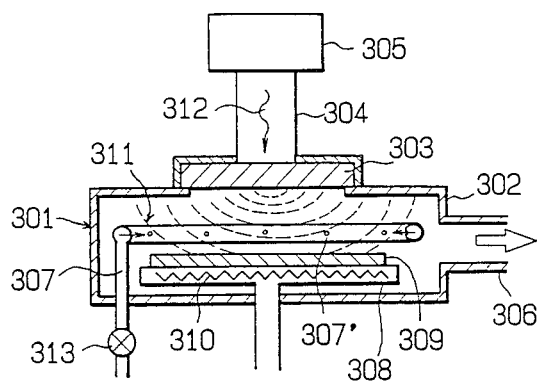
FIG. 3 is a schematic cross sectional view of the known apparatus for forming a functional deposited film on a plane substrate by using microwave plasma CVD process.

There was prepared a functional deposited film, member, namely, a photosensitive member for use in electrophotography using the apparatus shown in FIGS. 2(A) and 2(B) having an improved vacuum sealing structure as shown in FIG. 1(A).

FIG. 2(A) is a schematic perspective view illustrating an apparatus for forming a functional deposited film using microwave plasma CVD process suitable for preparing a photosensitive drum for use in electrophotography, and FIG. 2(B) shows the state that an upper wall of said apparatus is removed for forming an opening.

In FIGS. 2(A) and 2(B), there are shown a cylindrical deposition chamber 201, microwave introducing windows 202 made of a microwave transmissive material, wave guides 203, microwaves 204, an exhaust pipe 205, cylindrical drum substrates 206 and plasma generation space 207. The plasma generation space 207 is so structured to have a microwave cavity resonant structure by the microwave introducing windows 202. A plurality of the substrates 206 are arranged concentrially in the way that they can effectively absorb an energy of microwave to be introduced.

As shown in FIG. 2(B), the cylindrical deposition chamber 201 has such structure that an upper wall plate 208, the microwave introducing window 202 and the wave guide 203 can be together removed to thereby form an opening through which the substrates 206 can be easily taken in or out.

For the vacuum sealing structure of the connecting portion 202 between the upper wall plate 208 and the circumferential wall of the cylindrical deposition chamber 201, the structure shown in FIG. 1(A) was used in this example. And, the structure shown in FIG. 1(C) was used in the following comparative example.

In every case, there was used a rubber O-shaped ring as the vacuum sealing means. And in the example of this invention, there was used a spiral shielding member made of a stainless steel as the electromagnetic wave shielding means.

In this example and also in a comparative example, the preparation of a plurality of photosensitive members for use in electrophotography was carried out in the following way.

That is, firstly, the air in the deposition chamber 201 was evacuated through the exhaust pipe to bring the inside atmosphere of the deposition chamber 201 to a predetermined vacuum. Then, the cylindrical drum substrates 206 being arranged in the deposition chamber 201 were heated by actuating a heater installed in a substrate holder (not shown) to and kept at a predetermined temperature and they were kept rotating at a predetermined revolution speed using a motor (not shown).

Thereafter, corresponding raw material gases were introduced into the deposition chamber 201 to thereby prepare a plurality of cylindrical shaped photosensitive members for use in electrophotography having a charge injection inhibition layer, a photoconductive layer and a surface layer in this order on the cylindrical substrate under the conditions shown in Table 1.

TABLE 1

| | Gas used | Flow rate (SCCM) | Inner pressure (m Torr) | Microwave power (W) |
|---|---|---|---|---|
| Charge injection inhibition layer | $SiH_4$ | 500 | 1.5 | 700 |
| | $H_2$ | 500 | | |
| | $B_2H_6$ | 2000 ppm | | |
| | NO | 20 | | |
| Photoconductive layer | $SiH_4$ | 800 | 2 | 1500 |
| | $H_2$ | 500 | | |
| Surface layer | $SiH_4$ | 200 | 3 | 1000 |
| | $CH_4$ | 1000 | | |

The resultant photosensitive members were evaluated for their image-making properties using a conventional Canon electrophotographic copying machine NP 7550 (product of Canon Kabushiki Kaisha).

As a result, there were obtained the results as shown in Table 2.

As will be clear from the results shown in Table 2, there were obtained excellent results in both the example of this invention and the comparative example in the first film forming operation. However, in the comparative example, the quality of an image obtained was gradually reduced as the film forming operation was repeated.

TABLE 2

| | Film forming operation time | | | |
|---|---|---|---|---|
| Evaluation item | 1 | 5 | 10 | 20 |
| Example of this invention | | | | |
| Smeared image | | | | |
| Defective image | | | | |
| Comparative Example | | | | |
| Smeared image | | | Δ | x |
| Defective image | | Δ | x | x |

: Excellent
: good
Δ: practically usable
x: practically unusable

And there were found the following facts in the case of the comparative example: (i) the occurrence of a smeared image is caused by the air which is leaked into the deposition chamber 201 due to that the O-shaped ring is over-heated and eventually deteriorated and (ii) the occurrence of the defective image is caused due to a foreign deposited film formed on the O-shaped ring and in the clearance between the upper wall plate 208 and the sealed wall portion of the deposition chamber 201 up to the O-shaped ring (which corresponds to the clearance 104 in FIG. 1(C) comes off and adhered onto the substrate when removing the upper wall plate 208.

On the other hand, in the case of the apparatus according to this invention with which the spiral shaped electromagnetic wave shielding member is provided in the side of microwave plasma generation space, such problems relating to reduction in the quality of an image obtained as found in the comparative example do not occur and a desired functional deposited film can be repeatedly prepared at a high deposition rate.

What is claimed is:

1. In an apparatus for the formation of a functional deposited film on a plurality of cylindrical substrates by means of microwave plasma chemical vapor deposition, said apparatus having a cylindrical deposition chamber comprising a circumferential wall having an end portion thereof provided with a microwave introducing window to which a waveguide extending from a microwave power source is connected, said cylindrical deposition chamber having a plasma generation space circumscribed by a plurality of rotatable cylindrical substrate holders, each said substrate holder having one of said cylindrical substrates thereon, said rotatable cylindrical substrate holders being concentrically arranged in said cylindrical deposition chamber, said cylindrical deposition chamber being provided with means for supplying a film-forming raw material gas into said plasma generation space and means for evacuating said cylindrical deposition chamber, the improvement which comprises: (a) a removable opening and shutting member provided with said microwave introducing window in order to permit removal or insertion of said cylindrical substrates in said cylindrical deposition chamber; (b) an electromagnetic wave shielding means and (c) a vacuum sealing means being arranged in that order from the side of the plasma generation space on the top of the circumferential wall of said deposition chamber to substantially enclose the inside of said deposition chamber, said electromagnetic wave shielding means comprising a spring structure of a metal selected from the group consisting of iron, copper, nickel, chromium, aluminum, tin, zinc and alloys containing at least one of said metals, which said spring structure exhibits sufficient elasticity to follow the changes in the clearance between said opening and shutting member and said circumferential wall of said deposition chamber.

2. The apparatus according to claim 1, wherein said spring structure has an L-letter-shaped portion or a circular portion.

3. In an apparatus for the formation of a functional deposited film on a plurality of cylindrical substrates by means of microwave plasma chemical vapor deposition, said apparatus having a cylindrical deposition chamber comprising a circumferential wall having an end portion thereof provided with a microwave introducing window to which a waveguide extending from a microwave power source is connected, said cylindrical deposition chamber having a plasma generation space circumscribed by a plurality of rotatable cylindrical substrate holders, each said substrate holder having one of said cylindrical substrates thereon, said rotatable cylindrical substrate holder being concentrically arranged in said cylindrical deposition chamber, said cylindrical deposition chamber being provided with means for supplying a film-forming raw material gas into said plasma generation space and means for evacuating said cylindrical deposition chamber, the improvement which comprises: (a) a removable opening and shutting member provided with said microwave introducing window in order to permit removal or insertion of said cylindrical substrates in said cylindrical deposition chamber; wherein said circumferential wall comprises an interior circumferential wall and an exterior circumferential wall being arranged concentrically in that order from the side of the plasma generation space; (b) an electromagnetic wave shielding means and (c) a vacuum sealing means being arranged in that order from the side of the plasma generation space respectively on the top of said interior circumferential wall and on the top of said exterior circumferential wall to substantially enclose the inside of said deposition chamber, said electromagnetic wave shielding means comprising a spring structure of a metal selected from the group consisting of iron, copper, nickel, chromium, aluminum, tin, zinc and alloys containing at least one of said metals, which said spring structure exhibits sufficient elasticity to follow the changes in the clearance between the said opening and shutting member and the circumferential wall of said deposition chamber.

4. The apparatus according to claim 3, wherein said spring structure has a L-letter-shaped portion or a circular portion.

* * * * *

UNITED STATES PATENT AND TRADEMARK OFFICE
CERTIFICATE OF CORRECTION

PATENT NO. : 4,840,139
DATED : June 20, 1989
INVENTOR(S) : TETSUYA TAKEI, ET AL.

It is certified that error appears in the above-identified patent and that said Letters Patent is hereby corrected as shown below:

Title page:

IN [57] ABSTRACT

Line 5, "out a" should read --out of a--.

COLUMN 1

Line 19, "photosensitive device" should read --photosensitive devices--.
Line 22, "amorphous semiconductor film," should read --amorphous semiconductor films,--.
Line 60, "microwaves" should read --microwaves 312--.
Line 61, "312 from" should be deleted.
Line 63, "resonant" (second occurrence) should read --resonate--.

COLUMN 2

Line 1, "about" should be deleted.
Line 19, "wave" should read --waves--.
Line 27, "or remove" should read --insert or remove--.
Line 32, "vaccum" should read --vacuum--.
Line 37, "views" should read --view--.
Line 56, "leakes" should read --leaks--.

COLUMN 3

Line 17, "an" should read --a--.

UNITED STATES PATENT AND TRADEMARK OFFICE
CERTIFICATE OF CORRECTION

PATENT NO. : 4,840,139

DATED : June 20, 1989

INVENTOR(S) : TETSUYA TAKEI, ET AL.

It is certified that error appears in the above-identified patent and that said Letters Patent is hereby corrected as shown below:

COLUMN 4

Line 13, "obtained a" should be deleted.
Line 31, "out said" should read --out of said--.
Line 41, "cross sec-" should read --cross-sec- --.
Line 46, "cross sectional" should read --cross-sectional--.
Line 55, "cross sectional" should read --cross-sectional--.

COLUMN 5

Line 62, "a L-letter shaped portion" should read --an L-letter-shaped portion--.
Line 68, "(a C-letter like shaped structure)," should read --(a C-letter-like-shaped structure),--.

COLUMN 6

Line 18, "coat" should read --coats--.

COLUMN 7

Line 8, "intented" should read --intended--.

UNITED STATES PATENT AND TRADEMARK OFFICE
CERTIFICATE OF CORRECTION

PATENT NO. : 4,840,139
DATED : June 20, 1989
INVENTOR(S) : TETSUYA TAKEI, ET AL.

It is certified that error appears in the above-identified patent and that said Letters Patent is hereby corrected as shown below:

COLUMN 8

TABLE 2 should read:

-- 
TABLE 2

| Evaluation item | Film forming operation time | | | |
|---|---|---|---|---|
| | 1 | 5 | 10 | 20 |
| *Example of this invention* | | | | |
| Smeared image | ◉ | ◉ | ◉ | ○ |
| Defective image | ◉ | ◉ | ○ | ○ |
| *Comparative Example* | | | | |
| Smeared image | ◉ | ○ | △ | X |
| Defective image | ◉ | △ | X | X |

◉ : Excellent
○ : good
△ : practically usable
X : practically unusable --.

COLUMN 8

Figure 1C:
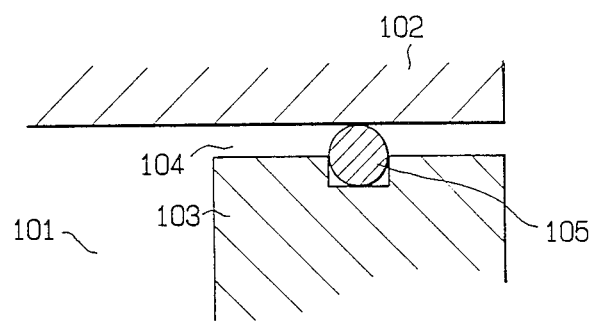
FIG. 1(C) is a schematic partial cross sectional view illustrating the portion around a vacuum sealing means in the known apparatus for forming a deposited film by using microwave plasma CVD process.

Line 54, "FIG. 1(C)" should read --FIG. 1(C))--.

UNITED STATES PATENT AND TRADEMARK OFFICE
CERTIFICATE OF CORRECTION

PATENT NO. : 4,840,139
DATED : June 20, 1989
INVENTOR(S) : TETSUYA TAKEI, ET AL.

It is certified that error appears in the above-identified patent and that said Letters Patent is hereby corrected as shown below:

COLUMN 10

Line 8, "substrate holder" should read --substrate holders--.
Line 37, "a" (first occurrence) should read --an--.

Signed and Sealed this

Twenty-sixth Day of November, 1991

Attest:

HARRY F. MANBECK, JR.

Attesting Officer     Commissioner of Patents and Trademarks